United States Patent [19]

Ryu et al.

[11] Patent Number: 5,739,055
[45] Date of Patent: Apr. 14, 1998

[54] METHOD FOR PREPARING A SUBSTRATE FOR A SEMICONDUCTOR PACKAGE

[75] Inventors: Jaechul Ryu; Wonsik Seo, both of Kyunggi-do, Rep. of Korea

[73] Assignee: Samsung Aerospace Industries, Ltd., Kyongsangnam-do, Rep. of Korea

[21] Appl. No.: 608,503

[22] Filed: Feb. 28, 1996

[30] Foreign Application Priority Data

Aug. 11, 1995 [KR] Rep. of Korea ............ 95-24814

[51] Int. Cl.⁶ ................................................ H01L 21/60
[52] U.S. Cl. ........................ 438/125; 205/125; 427/98; 174/257
[58] Field of Search ........................ 437/180, 217, 437/209; 205/125, 183; 427/98; 174/257; 438/125

[56] References Cited

U.S. PATENT DOCUMENTS

| | | |
|---|---|---|
| 3,520,054 | 7/1970 | Pensack et al. |
| 4,569,876 | 2/1986 | Nakakita |
| 5,073,518 | 12/1991 | Doan et al. |
| 5,308,792 | 5/1994 | Okabayashi et al. |
| 5,323,520 | 6/1994 | Peters et al. |
| 5,380,371 | 1/1995 | Murakami |
| 5,547,902 | 8/1996 | Rohner |
| 5,565,267 | 10/1996 | Capote et al. |

FOREIGN PATENT DOCUMENTS 7-161905  6/1995  Japan.

*Primary Examiner*—John Niebling
*Assistant Examiner*—Kevin F. Turner
*Attorney, Agent, or Firm*—Finnegan, Henderson, Farabow, Garrett & Dunner, L.L.P.

[57] ABSTRACT

A method for making a substrate for a semiconductor package comprising forming a conductive layer having a desired circuit pattern on the substrate; curing the conductive layer; and coining the cured conductive layer to make its surface uniform. The cured conductive layer may be plated with Ni, and subsequently with Au, and shaped to form a Au-plated board.

7 Claims, 2 Drawing Sheets

METHOD FOR PREPARING A SUBSTRATE FOR A SEMICONDUCTOR PACKAGE

BACKGROUND OF THE INVENTION

1. Field of the Invention

The present invention relates to a method for preparing a substrate for a semiconductor package, and more particularly, to a method for preparing a substrate for a semiconductor package by forming patterns using conductive ink.

2. Description of the Related Arts

Generally, a semiconductor package includes chip carriers mounted on a printed circuit board. Lead frames are preferably used as a chip carrier. Recently, with the trend to miniaturize the package, the surface-mount technology has been developed in which the lead frame is functionally integrated onto the printed circuit board so that chips can be directly mounted on the board, without using the lead frame. In view of the above trend, research on the concept of wire bonding after chip mounting onto the board has increased.

The printed circuit boards or printed circuit boards for surface-mount are typically patterned by an etching method. In the etching method, the printed circuit board is prepared by plating copper-clad on an insulator. The insulator is laminated with polymeric resin on a base material. The unnecessary part of the copper-clad is dissolved and removed with chemicals to form a conductor pattern.

The boards for semiconductor packages can be produced on a large scale using the etching method as described above. However, the etching method involves more than 30 process steps, resulting in a high equipment and production cost, and a high cost for treatment of waste water.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

SUMMARY OF THE INVENTION

To achieve the objects and in accordance with the purpose of the invention, as embodied and broadly described herein, the invention comprises the steps of forming a conductive layer having a desired circuit pattern on the substrate; curing the conductive layer; and coining the cured conductive layer to make the surface of the conductive layer substantially uniform.

The accompanying drawings, which are incorporated in and constitute a part of his specification, illustrate one embodiment of the invention and together with the description, serve to explain the principles of the invention.

DETAILED DESCRIPTION OF THE PREFERRED EMBODIMENT

Figure 1:
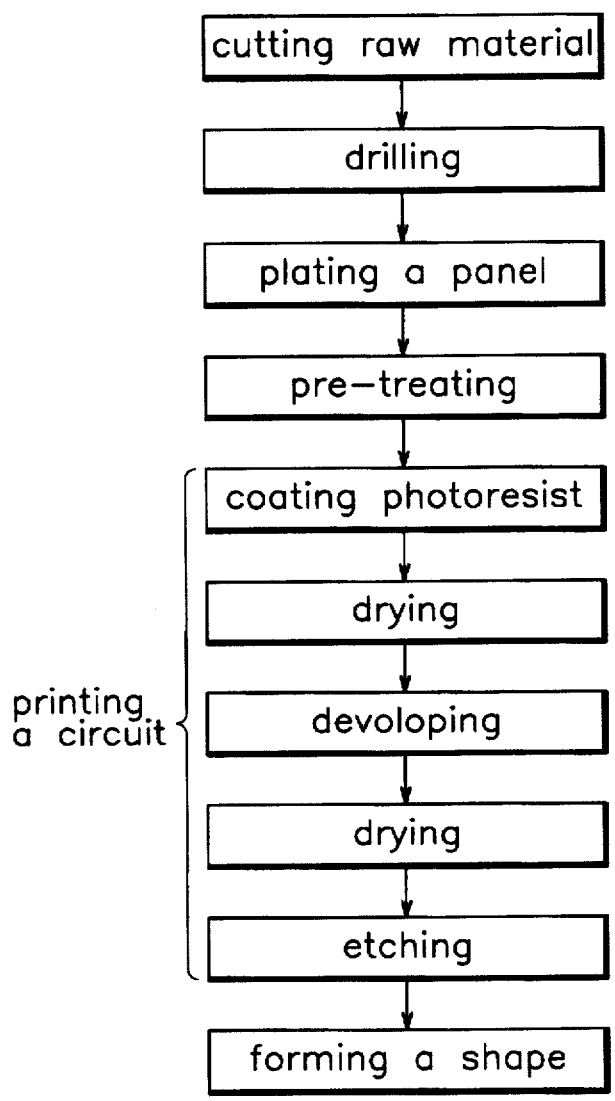
FIG. 1 is a flow chart showing a conventional process for producing a printed circuit board for a semiconductor package.
Figure 2:
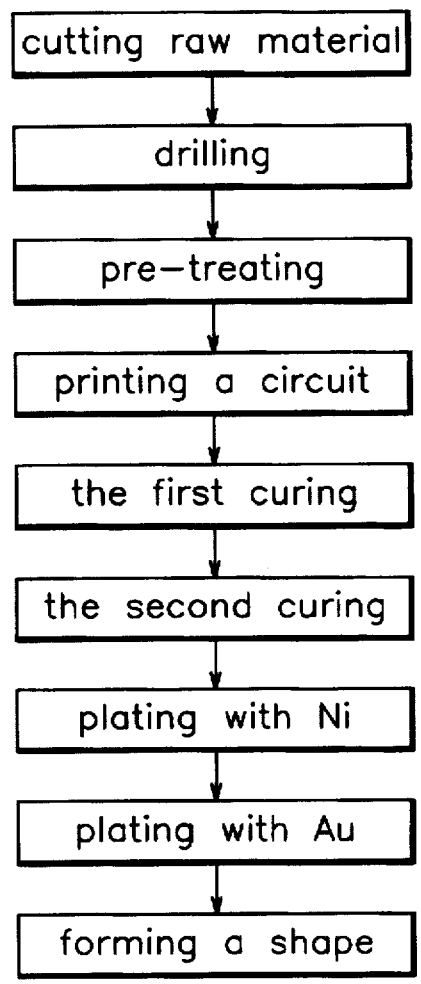
FIG. 2 is a flow chart showing a process for producing a printed circuit board for a semiconductor package according to an embodiment of the present invention.

This present invention, as embodied herein, is illustrated in reference to FIG. 2.

Figure 3:
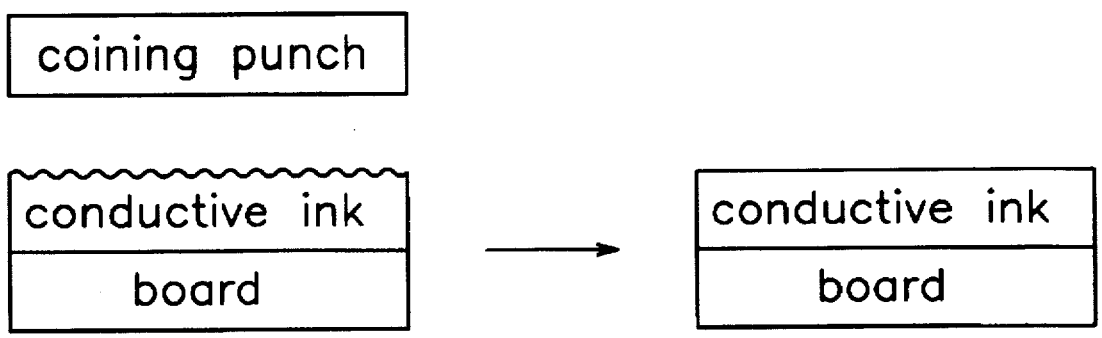
FIG. 3 is a cross-sectional view of the printed circuit board before and after coining when the coining of the printed circuit board is carried out after the first curing or the second curing according to the embodiment of the present invention.

A printed circuit board is drilled to provide through holes and via holes, and a desired conductive pattern is preferably screen printed on the board with a silk screen, using conductive inks containing metals such as copper, silver and lead. The printing circuit step further includes the steps of coating photoresist on the substrate, exposing the photoresist to light using a mask having a circuit pattern, stripping (delaminating) the exposed part of photoresist on the substrate, coating a conductive ink on the delaminated part of the substrate to form a circuit consisting of the conductive ink on the substrate, and removing the remaining photoresist. Thereafter, the board is cured the first time ("first curing"); cured the second time ("second curing"); plated with Ni; plated with Au; and shaped to be suitable for a semiconductor package. It is preferred that the first curing is done at a temperature of 50° to 150° C. and the second curing at a temperature of 100° to 250° C. In order to smoothen the rough surface of the conductive (ink) pattern, coining is carried out after the first curing or the second curing, as illustrated in FIG. 3.

Figure 4:
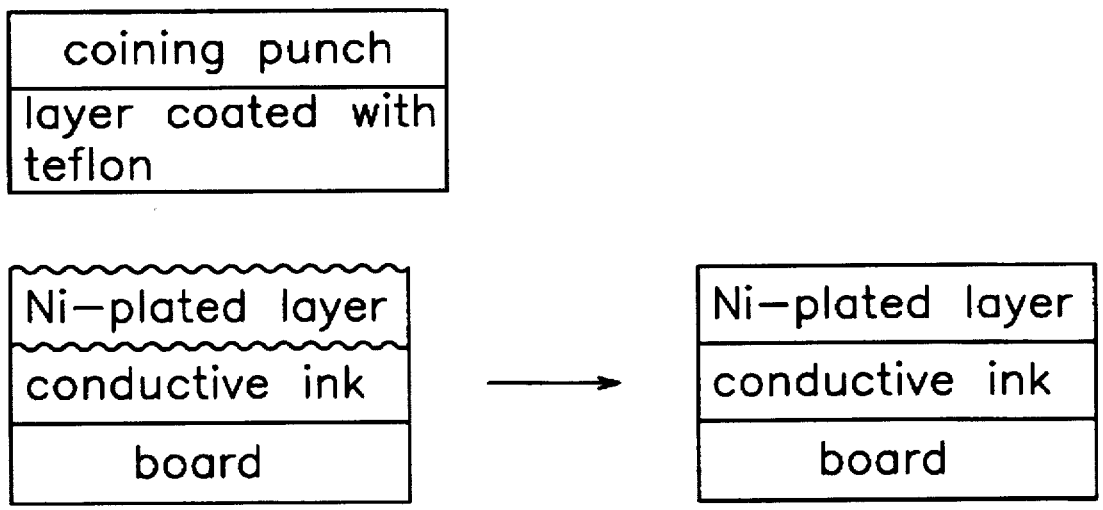
FIG. 4 is a cross-sectional view of the printed circuit board before and after coining when the coining of the printed circuit board is carried out after the Ni plating according to the embodiment of the present invention.

Alternatively, the coining is carried out after the plating with Ni using a coining punch, as illustrated in FIG. 4. When the coining is carried out after the plating with Ni using the coining punch coated with teflon thereon, foreign materials can be prevented from adhering to the surface of the conductive pattern.

After inspecting the printed circuit board having the desired conductive pattern made as described above, the printed circuit board is preferably screen printed with a solder using a silk screen, and subsequently coated with an adhesive. Thereafter, components are mounted onto the coated board; and the printed circuit board with the components mounted thereon is dried, heat-soldered, washed, and potted to make a semiconductor package.

The embodiment of the present invention is further explained in reference to the following examples. These examples are intended to be purely exemplary of the invention, but not intended to limit the scope of the present invention.

EXAMPLE 1

A printed board of size of 6"×6" was drilled to provide through holes and via holes, and a desired conductive pattern was screen printed on the printed circuit board with a conductive ink containing copper, using a silk screen. Coining was carried out after the first curing. After the second curing, the cured printed circuit board was plated with Ni, plated with Au, and shaped, to form a Au-plated printed circuit board for semiconductor packaging.

After inspection, the printed circuit board having the desired conductive pattern was screen printed with a solder using a silk screen, and coated with an adhesive. Then, components were mounted on to the coated printed circuit board, and the board with the components mounted thereonto was dried, heat-soldered, and potted to make a semiconductor package.

EXAMPLE 2

A semiconductor package was prepared by the same procedure as in Example 1 except that the coining was carried out after the second curing.

EXAMPLE 3

A semiconductor package was prepared by the same procedure as in Example 1 except that the coining was carried out after the plating with Ni.

EXAMPLE 4

A printed circuit board having a size of 6"×6" was drilled to provide through holes and via holes, and plated with copper by chemical and electro-plating method. The plated circuit board was cleaned by a mixture of 2% sodium carbonate, alcohol, and trichlene; and washed with water, then with 10% hydrochloric acid for 1 minute, and then again with water. Thereafter, the board was ground (or polished), washed with water, and dried to form a laminate. Then, a photoresist film was formed on the laminate, and dried at a temperature of 50° to 60° C. for 40 minutes. Then a silk screen having a desired conductive pattern was placed on the dried laminate to be exposed to light for 2 minutes. The exposed laminate was developed using a developing solution and dried. The developed laminate was plated with a solder; the photoresist was stripped; the printed circuit board was etched using ferrous chloride at a temperature of 30° C.; and the plated solder was stripped.

After inspection, the printed circuit board was coated with a solder resist, and exposed to light using a silk screen. The exposed printed circuit board was developed to print a solder resist. Then, the necessary parts of the board were marked using a silk screen; the necessary terminal parts were plated; and the parts which were not coated with the solder resist were soldered using a hot solder.

Thereafter, components were mounted onto the printed circuit board. The board mounted with the components as such was dried, dipped into the solder bath, and the excess leads were cut, and the board was washed and potted to make a semiconductor package.

As described above, to make a printed circuit board having a conductive ink pattern printed thereon, thus requiring no lead frame and enabling surface-mount, the process, as embodied hereinabove according to the present invention, reduces the number of production steps and thus decreases the production cost, when compared with the conventional method using etching. Further, the components can be more effectively mounted onto the board because the conductive pattern is directly provided on the surface of the printed circuit board.

When the printed circuit board is patterned using conductive inks, since the conductive ink contains metal particles, resin and solvent, the surface of the board tends to be rough, when compared with the patterning of the board only with metals as in the conventional method. This problem is further aggravated by the viscosity of the conductive solution. This roughness (or unevenness) of the surface typically occurs after the patterning, and has to be corrected to provide flatness for subsequent wire bonding.

According to the present invention, as embodied herein, to make the surface of the conductive ink layer even, coining of the surface of the conductive ink layer is carried out using coining punch after the curing or Ni plating. Since the smooth surface is provided, the components can be effectively attached onto the board and wire-bonded.

As described above, the process for making a printed circuit board, as embodied herein according to the present invention, for a semiconductor package significantly reduces the number of process steps, resulting in a low production and equipment cost, when compared with conventional method using etching.

What is claimed is:

1. A method for making a substrate for a circuit board, comprising the steps of:

drilling the circuit board to provide through holes and via holes;

screen printing a desired conductive layer having a desired circuit pattern on the substrate of the circuit board;

curing said conductive layer; and coining said cured conductive layer to make the surface of the conductive layer substantially uniform.

2. The method of claim 1, further comprising plating said cured conductive layer.

3. The method for making a substrate for a semiconductor package of claim 1, wherein said curing step comprises:

first curing said conductive layer at a temperature of 50° to 150° C.; and then second curing said cured conductive layer at a temperature of 100° to 250° C.

4. The method of claim 1, wherein said coining step is carried out using a coining punch having its surface coated with TEFLON thereon.

5. The method of claim 2, wherein said coining step is carried out after said plating step.

6. The method of claim 3, wherein said coining step is carried out after the first curing.

7. The method of claim 3, wherein said coining step is carried out after the second curing step.

* * * * *

UNITED STATES PATENT AND TRADEMARK OFFICE
CERTIFICATE OF CORRECTION

PATENT NO. : 5,739,055
DATED : April 14, 1998
INVENTOR(S) : Jaechul RYU et al.

It is certified that error appears in the above-identified patent and that said Letters Patent is hereby corrected as shown below:

Claim 3, Column 4, lines 33-34, after "method", delete "for making a substrate for a semiconductor package".

Signed and Sealed this

Sixteenth Day of March, 1999

Attest:

Q. TODD DICKINSON

Attesting Officer

Acting Commissioner of Patents and Trademarks